US010553464B2

(12) United States Patent
Jeong et al.

(10) Patent No.: US 10,553,464 B2
(45) Date of Patent: Feb. 4, 2020

(54) SYSTEM AND METHOD FOR CONTROLLING SEMICONDUCTOR MANUFACTURING FACILITY, METHOD OF MANUFACTURING INTEGRATED CIRCUIT USING THE SYSTEM AND METHOD, AND METHOD OF MANUFACTURING PROCESSOR USING THE SYSTEM AND METHOD

(71) Applicant: SAMSUNG ELECTRONICS CO., LTD., Suwon-si, Gyeonggi-do (KR)

(72) Inventors: Jae Won Jeong, Hwaseong-si (KR); Yi Jin, Seoul (KR); Chang Gi Min, Daejeon (KR); Jin Woo Lee, Seoul (KR); Seok Heo, Hwaseong-si (KR); Yong Won Choi, Yongin-si (KR); Yun Jong Choi, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 106 days.

(21) Appl. No.: 15/950,303

(22) Filed: Apr. 11, 2018

(65) Prior Publication Data
US 2019/0088515 A1    Mar. 21, 2019

(30) Foreign Application Priority Data
Sep. 20, 2017 (KR) .................. 10-2017-0121221

(51) Int. Cl.
*H01L 21/67* (2006.01)
*G05B 19/418* (2006.01)

(52) U.S. Cl.
CPC .. *H01L 21/67276* (2013.01); *G05B 19/41875* (2013.01); *G05B 2219/37399* (2013.01); *G05B 2219/45027* (2013.01); *G05B 2219/45031* (2013.01)

(58) Field of Classification Search
CPC ........ H01L 21/67276; H01L 21/67253; G05B 2219/45031; G05B 19/41875
See application file for complete search history.

(56) References Cited

U.S. PATENT DOCUMENTS

| | | | |
|---|---|---|---|
| 6,435,023 | B1 | 8/2002 | Kobayashi et al. |
| 6,454,177 | B1 | 9/2002 | Sasao et al. |
| 7,658,200 | B2 | 2/2010 | Choi et al. |
| 7,925,390 | B2 | 4/2011 | Jingu et al. |
| 2007/0253831 | A1 | 11/2007 | Lee |
| 2008/0006650 | A1 | 1/2008 | Tseng et al. |
| 2012/0144938 | A1 | 6/2012 | Inagaki et al. |

(Continued)

FOREIGN PATENT DOCUMENTS

| | | |
|---|---|---|
| JP | 2001-267293 A | 9/2001 |
| JP | 2006-135223 A | 5/2006 |
| KR | 10-2016-0053593 A | 5/2016 |

*Primary Examiner* — Vincent H Tran
(74) *Attorney, Agent, or Firm* — Lee & Morse, P.C.

(57) ABSTRACT

A method for controlling a semiconductor manufacturing facility includes measuring output change amounts of differential pressure sensors in the facility when pressure conditions change by a number of fans. The fans are then classified into different groups and subgroups and control sequences of the subgroups are determined based on the change amounts. Difference values are then calculated, and a control signal is generated to adjust the rotation speed of the fans.

20 Claims, 14 Drawing Sheets

(56) References Cited

U.S. PATENT DOCUMENTS

| | | | |
|---|---|---|---|
| 2013/0245836 A1* | 9/2013 | Goodfellow | F24F 11/0001 |
| | | | 700/276 |
| 2016/0227675 A1* | 8/2016 | North | H05K 7/20836 |
| 2016/0261116 A1* | 9/2016 | Barooah | G06Q 50/06 |
| 2017/0051938 A1* | 2/2017 | Buchanan | F24F 11/74 |
| 2017/0164522 A1* | 6/2017 | Wong | H05K 7/1492 |

* cited by examiner

FIG. 4

|  | FAN1 | FAN2 | FAN3 | FAN4 |
|---|---|---|---|---|
| Apparatus1 (101) | a1 | b1 | c1 | d1 |
| Apparatus2 (102) | a2 | b2 | c2 | d2 |
| Apparatus3 (103) | a3 | b3 | c3 | d3 |

FIG. 5

|  | FAN1 | FAN2 | FAN3 | FAN4 |
|---|---|---|---|---|
| Apparatus1 (101) | a1 | b1 | c1 | d1 |
| Apparatus2 (102) | a2 | b2 | c2 | d2 |
| Apparatus3 (103) | a3 | b3 | c3 | d3 |

|  | SG2<br>FAN1 | G2<br>FAN2 | G1 SG1<br>FAN3 | SG2<br>FAN4 |
|---|---|---|---|---|
| Apparatus1<br>(101) | a1 | b1 | c1 | d1 |
| Apparatus2<br>(102) | a2 | b2 | c2 | d2 |
| Apparatus3<br>(103) | a3 | b3 | c3 | d3 |

SYSTEM AND METHOD FOR CONTROLLING SEMICONDUCTOR MANUFACTURING FACILITY, METHOD OF MANUFACTURING INTEGRATED CIRCUIT USING THE SYSTEM AND METHOD, AND METHOD OF MANUFACTURING PROCESSOR USING THE SYSTEM AND METHOD

CROSS-REFERENCE TO RELATED APPLICATION

Korean Patent Application No. 10-2017-0121221, filed on Sep. 20, 2017, and entitled, "System and Method for Controlling Semiconductor Manufacturing Facility, Method of Manufacturing Integrated Circuit Using the System and Method, and Method of Manufacturing Processor Using the System and Method," is incorporated by reference herein in its entirety.

BACKGROUND

1. Field

One or more embodiments described herein relate to semiconductor technology.

2. Description of the Related Art

The pressure and air flow inside a semiconductor manufacturing facility may affect performance and yield. For example, the pressure and air flow in such a facility may allow external particles to be introduced that may contaminate various processes. Additionally, or alternatively, pressure and air flow may allow particles inside the facility to be discharged outside of the facility. One attempt to manage the air flow inside a semiconductor manufacturing facility involves maintaining the pressure inside the facility to be higher than outside the facility. Also, air flow inside the facility may be adjusted by keeping the difference in pressure between apparatuses inside the constant.

SUMMARY

In accordance with one or more embodiments, a method for controlling a semiconductor manufacturing facility includes measuring, by grouping logic, first, second, and third output change amounts of respective first, second, and third differential pressure sensors in the semiconductor manufacturing facility when a pressure condition is changed from a first pressure condition to a second pressure condition by a plurality of fans in the semiconductor manufacturing facility, and classifying some of the fans as a first group and remaining ones of the fans as a second group based on the first through third output change amounts; classifying, by a sequence determinator, some of the fans in the first group as a first subgroup and remaining ones of the fans in the first group as a second subgroup, and determining a control sequence of the first subgroup and the second subgroup based on the first to third output change amounts.

The method further includes calculating, by an index generator, a first difference value, a second difference value, and a third difference value, the first difference value based on a difference between a first average value, which is an average value of a first output of the first differential pressure sensor under an operating pressure of the semiconductor manufacturing facility, and a target value which is a target output value of the semiconductor manufacturing facility, the second difference value based on a difference between a second average value, which is an average value of a second output of the second differential pressure sensor under the operating pressure of the semiconductor manufacturing facility, and the target value, and the third difference value based on a difference between a third average value, which is an average value of a third output of the third differential pressure sensor under the operating pressure of the semiconductor manufacturing facility, and the target value.

The method further includes generating a first regulation performance index (RPI) corresponding to a difference between the first difference value and the second difference value and a second RPI corresponding to a difference between the second difference value and the third difference value; and receiving, by a controller, information corresponding to the first and second groups, information corresponding to the control sequence and the first RPI and the second RPI and generating a control signal to adjust a rotation speed of each of the fans.

The first differential pressure sensor is to measure a pressure difference between outside of the semiconductor manufacturing facility and a first point in the semiconductor manufacturing facility, the second differential pressure sensor is to measure a pressure difference between outside of the semiconductor manufacturing facility and a second point in the semiconductor manufacturing facility, the third differential pressure sensor is to measure a pressure difference between outside of the semiconductor manufacturing facility and a third point in the semiconductor manufacturing facility.

The first output change amount corresponds to an amount of change between a measured value of the first differential pressure sensor under the first pressure condition and a measured value of the first differential pressure sensor under the second pressure condition, the second output change amount corresponds to an amount of change between a measured value of the second differential pressure sensor under the first pressure condition and a measured value of the second differential pressure sensor under the second pressure condition, and the third output change amount corresponds to an amount of change between a measured value of the third differential pressure sensor under the first pressure condition and a measured value of the third differential pressure sensor under the second pressure condition. Other embodiments are disclosed below.

BRIEF DESCRIPTION OF THE DRAWINGS

Features will become apparent to those of skill in the art by describing in detail exemplary embodiments with reference to the attached drawings in which:

FIGS. 4 to 6 illustrate an embodiment for operating an initial grouping unit, a grouping unit, and a sequence determinator, respectively;

DETAILED DESCRIPTION

Figure 1:
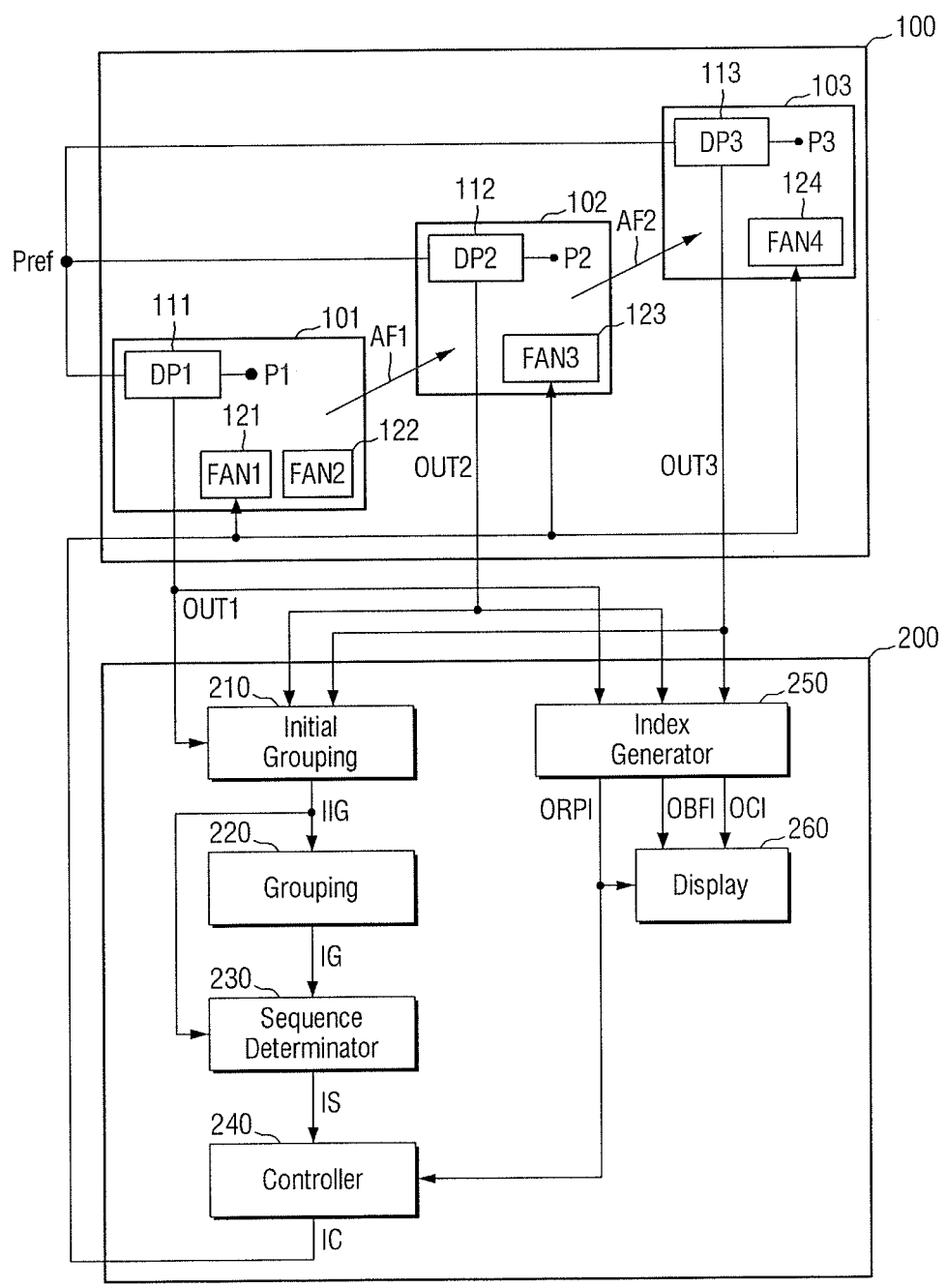
FIG. 1 illustrates an embodiment of a system for controlling a semiconductor manufacturing facility.
Figure 2:
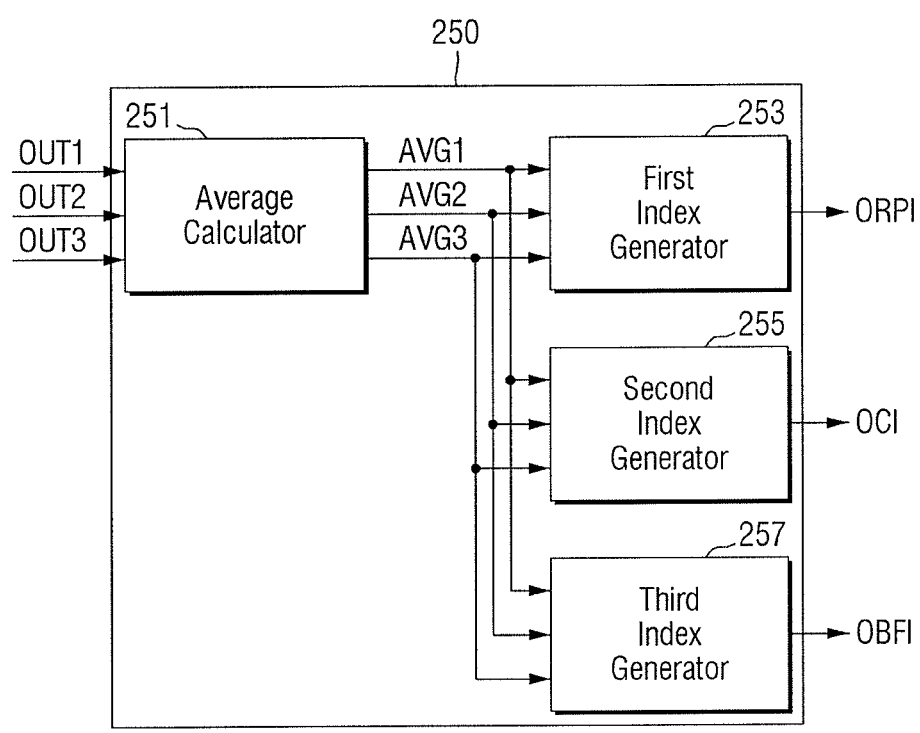
FIG. 2 illustrates an embodiment of an index generator.

FIG. 1 illustrates an embodiment of a system 200 for controlling a semiconductor manufacturing facility 100. FIG. 2 illustrates an embodiment of an index generator 250 of FIG. 1.

Referring to FIGS. 1 and 2, the system 200 for controlling the semiconductor manufacturing facility 100 includes an initial grouping unit 210, a grouping unit 220, a sequence determinator 230, a controller 240, the index generator 250, and a display 260.

The system 200 for controlling the semiconductor manufacturing facility 100 may receive from the semiconductor manufacturing facility 100 first through third outputs OUT1, OUT2, and OUT3 of first through third differential pressure sensors 111, 112 and 113, respectively, in the semiconductor manufacturing facility 100.

The semiconductor manufacturing facility 100 may include a first apparatus 101, a second apparatus 102, a third apparatus 103, and a plurality of fans (121, 122, 123 and 124). The first apparatus 101 may be adjacent to the second apparatus 102. The second apparatus 102 may be adjacent to the third apparatus 103. The third apparatus 103 may be farther away from the first apparatus 101 than the second apparatus 102. In the drawings, the semiconductor manufacturing facility 100 includes the first to third apparatuses 101, 102, and 103. However, the semiconductor manufacturing facility 100 may include a different number (more or less than three) apparatuses in another embodiment, and/or other apparatuses in addition to the first through third apparatuses 101, 102, and 103.

The first apparatus 101 may include the first differential pressure sensor 111, a first fan 121, and a second fan 122. The first differential pressure sensor 111 may measure the pressure difference between outside the semiconductor manufacturing facility 100 and a first point P1 in the semiconductor manufacturing facility 100 to generate the first output OUT1.

The second apparatus 102 may include the second differential pressure sensor 112 and a third fan 123. The second differential pressure sensor 112 may measure a pressure difference between outside the semiconductor manufacturing facility 100 and a second point P2 in the semiconductor manufacturing facility 100 to generate the second output OUT2.

The third apparatus 103 may include the third differential pressure sensor 113 and a fourth fan 124. The third differential pressure sensor 113 may measure a pressure difference between outside the semiconductor manufacturing facility 100 and a third point P3 in the semiconductor manufacturing facility 100 to generate the third output OUT3.

Outside the semiconductor manufacturing facility 100 may be, for example, a specific point Pref defined outside the semiconductor manufacturing facility 100. In the drawings, the first through third differential pressure sensors 111, 112, and 113 measure pressure based on the specific point Pref outside the semiconductor manufacturing facility 100. In one embodiment, the first through third differential pressure sensors 111, 112, and 113 may measure pressure based on points outside the semiconductor manufacturing facility 100 adjacent to the first through third apparatuses 101, 102 and 103, respectively.

The first to third points P1, P2, and P3 may be specific points inside the first through third apparatuses 101, 102, and 103, respectively. The second point P2 may be closest to the third point P3. The third point P3 may be farther away from the first point P1 than the second point P2.

The first through fourth fans 121, 122, 123, and 124 are illustrated as being inside the first to third apparatuses 101, 102, and 103 in the semiconductor manufacturing facility 100. However, at least one of the first to fourth fans 121, 122, 123, and 124 may be outside the first to third apparatuses 101, 102, and 103 in the semiconductor manufacturing facility 100. Even in this case, the first fan 121 and the second fan 122 may still be related to the first apparatus 101, the third fan 123 may still be related to the second apparatus 102, and the fourth fan 124 may still be related to the third apparatus 103. Example relationships between each apparatus and fan will be described with reference to FIGS. 4 through 6.

The semiconductor manufacturing facility 100 has been illustrated to include the first to fourth fans 121, 122, 123, and 124. In one embodiment, the semiconductor manufacturing facility 100 may include other fans in addition to the first to fourth fans 121, 122, 123, and 124.

In the semiconductor manufacturing facility 100, air may flow from the first apparatus 101 toward the second apparatus 102 (as represented by a first air flow AF1), and may flow from the second apparatus 102 toward the third apparatus 103 (as represented by a second air flow AF2). For example, air may flow sequentially from the first apparatus 101 to the third apparatus 103, via the second apparatus 102, in the order of the first air flow AF1 and the second air flow AF2. When this occurs, air flow in the semiconductor manufacturing facility 100 may be considered to be normal.

The first to third outputs OUT1, OUT2, and OUT3 of the first to third differential pressure sensors 111, 112, and 113 may be provided to the system 200 for controlling the semiconductor manufacturing facility 100. The initial grouping unit 210 of the system 200 may receive the first to third outputs OUT1, OUT2, and OUT3 of the first to third differential pressure sensors 111, 112, and 113 and output first to third output change amounts of the first to third differential pressure sensors 111, 112, and 113.

For example, the initial grouping unit 210 may receive the first to third outputs OUT1, OUT2, and OUT3 of the first to third differential pressure sensors 111, 112, and 113 under a first pressure condition. The initial grouping unit 210 may receive the first to third outputs OUT1, OUT2, and OUT3 of the first to third differential pressure sensors 111, 112, and 113 under a second pressure condition. The initial grouping unit 210 may calculate differences between the first to third outputs OUT1, OUT2, and OUT3 of the first to third differential pressure sensors 111, 112, and 113 under the first pressure condition and the first to third outputs OUT1, OUT2, and OUT3 of the first to third differential pressure sensors 111, 112, and 113 under the second pressure condition and output the calculated differences as the first to third output change amounts. Examples of the first to third output change amounts are described with reference to FIG. 4.

Information IIG about the first to third output change amounts may be provided to the grouping unit 220 and the sequence determinator 230. The grouping unit 220 may classify some of the fans (e.g., the first to fourth fans 121, 122, 123, and 124) as a first group, and the rest of the fans as a second group, using the information IIG about the first to third output change amounts. An example is described with reference to FIG. 5. Information IG about the first group and the second group may be provided to the sequence determinator 230.

The sequence determinator 230 may receive the information IIG about the first to third output change amounts and the information IG about the first group and the second group and determine the control sequence of the fans in the first group. The sequence determinator 230 may divide the first group into a first subgroup and a second subgroup. In addition, the sequence determinator 230 may determine the control sequence of the first subgroup and the second subgroup. An example is described with reference to FIG. 6. Information IS about the control sequence may be provided to the controller 240. In some embodiments, the information IS about the control sequence may be generated after the semiconductor manufacturing facility 100 is set up.

The index generator 250 may receive the first to third outputs OUT1, OUT2, and OUT3 of the first to third differential pressure sensors 111, 112, and 113 and generate regulation performance indices (RPIs), correlation indices (CIs), and back flow indices (BFIs). The index generator 250 may generate indices under the operating pressure of the semiconductor manufacturing facility 100. For example, the first to third outputs OUT1, OUT2, and OUT3 of the first to third differential pressure sensors 111, 112, and 113 provided to the index generator 250 may be outputs under the operating pressure of the semiconductor manufacturing facility 100. The first to third outputs OUT1, OUT2, and OUT3 of the first to third differential pressure sensors 111, 112, and 113 may be input to an average calculator 251.

The average calculator 251 may calculate and output first to third average values AVG1, AVG2, and AVG3 of the first to third outputs OUT1, OUT2, and OUT3 of the first to third differential pressure sensors 111, 112, and 113, respectively. The respective first to third average values AVG1, AVG2, and AVG3 of the first to third outputs OUT1, OUT2, and OUT3 of the first to third differential pressure sensors 111, 112, and 113 may be provided to a first index generator 253, a second index generator 255, and a third index generator 257.

The first index generator 253 may calculate a first difference value which is a difference between the first average value AVG1 and a target value which is a target output value of the semiconductor manufacturing facility 100. The target output value of the semiconductor manufacturing facility 100 may be an ideal output value of the semiconductor manufacturing facility 100 under the operating pressure of the semiconductor manufacturing facility 100. The first index generator 253 may calculate a second difference value which is a difference between the second average value AGV2 and the target value. The first index generator 253 may calculate a third difference value which is a difference between the third average value AGV3 and the target value.

The first index generator 253 may generate a first RPI which is a difference between the first difference value and the second difference value. The first index generator 253 may also generate a second RPI which is a difference between the second difference value and the third difference value. Since the first point P1 and the third point P3 are not closest to each other, the first index generator 253 may not generate a difference between the first difference value and the third difference value. An output ORPI of the first index generator 253 may include the first RPI and the second RPI.

The second index generator 255 may calculate a correlation between the first average value AVG1 and the second average value AVG2. Also, the second index generator 255 may calculate a correlation between the second average value AVG2 and the third average value AVG3. An output OCI of the second index generator 255 may include information about the correlation between the first output OUT1 of the first differential pressure sensor 111 and the second output OUT2 of the second differential pressure sensor 112 and information about the correlation between the second output OUT2 of the second differential pressure sensor 112 and the third output OUT3 of the third differential pressure sensor 113.

The third index generator 257 may compare the first output OUT1 of the first differential pressure sensor 111 and the second output OUT2 of the second differential pressure sensor 112, and compare the second output OUT2 of the second differential pressure sensor 112 and the third output OUT3 of the third differential pressure sensor 113. The first output OUT1 of the first differential pressure sensor 111 may be greater than the second output OUT2 of the second differential pressure sensor 112 due to the first air flow AF1 from the first apparatus 101 to the second apparatus 102. In addition, the second output OUT2 of the second differential pressure sensor 112 may be greater than the third output OUT3 of the third differential pressure sensor 113 due to the second air flow AF2 from the second apparatus 102 to the third apparatus 103.

When the first output OUT1 of the first differential pressure sensor 111 is greater than the second output OUT2 of the second differential pressure sensor 112 and when the second output OUT2 of the second differential pressure sensor 112 is greater than the third output OUT3 of the third differential pressure sensor 113, the third index generator 257 may generate a first BFI. The first BFI may be, for example, a default value.

When the first output OUT1 of the first differential pressure sensor 111 is less than the second output OUT2 of the second differential pressure sensor 112, the third index generator 257 may generate a second BFI, which is a difference value between the first average value AVG1 and the second average value AVG2, in a corresponding time section. When the second output OUT2 of the second differential pressure sensor 112 is less than the third output OUT3 of the third differential pressure sensor 113, the third index generator 257 may generate a third BFI, which is a difference value between the second average value AVG2 and the third average value AVG3, in a corresponding time section.

An output OBFI of the third index generator 257 may be any one of the first BFI, second BFI, and third BFI according to the result of comparing the first output OUT1 of the first differential pressure sensor 111 with the second output OUT2 of the second differential pressure sensor 112 and comparing the second output OUT2 of the differential pressure sensor 112 with the third output OUT3 of the third differential pressure sensor 113.

Of the outputs ORPI, OCI and OBFI of the index generator 250, the outputs OBFI and OCI regarding BFI and CI may be provided to the display 260. Of the outputs ORPI, OCI, and OBFI of the index generator 250, the output ORPI regarding RPI may be provided to the display 260 and the controller 240. The index generator 250 may generate the outputs ORPI, OCI, and OBFI regarding indices in real time during the operation of the semiconductor manufacturing facility 100.

The controller 240 may receive the information IS about the control sequence and the output ORPI regarding RPI and generate a control signal IC. For example, when the output ORPI regarding RPI is abnormal (e.g., different from a predetermined output or value), the controller 240 may generate the control signal IC for adjusting the rotation speed of the first subgroup (e.g., SG1 in FIG. 6) and then the rotation speed of the second subgroup (e.g., SG2 in FIG. 6). Examples of the control sequence of the fans are described with reference to FIGS. 3 to 6.

When the output ORPI regarding RPI is abnormal (e.g., different from a predetermined output or value), a difference Diff1 between the first RPI and a first reference RPI RRPI1 (e.g., see FIG. 9) may be greater than a preset RPI. When the output ORPI regarding RPI is abnormal, the controller 240 may determine the rotation speed of each of the first subgroup (e.g., SG1 in FIG. 6) and the second subgroup (e.g., SG2 in FIG. 6) based on the output ORPI generated in real time.

The control signal IC may be provided to the fans of the semiconductor manufacturing facility 100. The control signal IC may include information to change the rotation speed of the fans. The control signal IC may also include information about fans to be controlled (e.g., the first group G1 in FIG. 5) and the control sequence of the fans to be controlled (e.g., the first subgroup SG1 and the second subgroup SG2 in FIG. 6).

Figure 3:
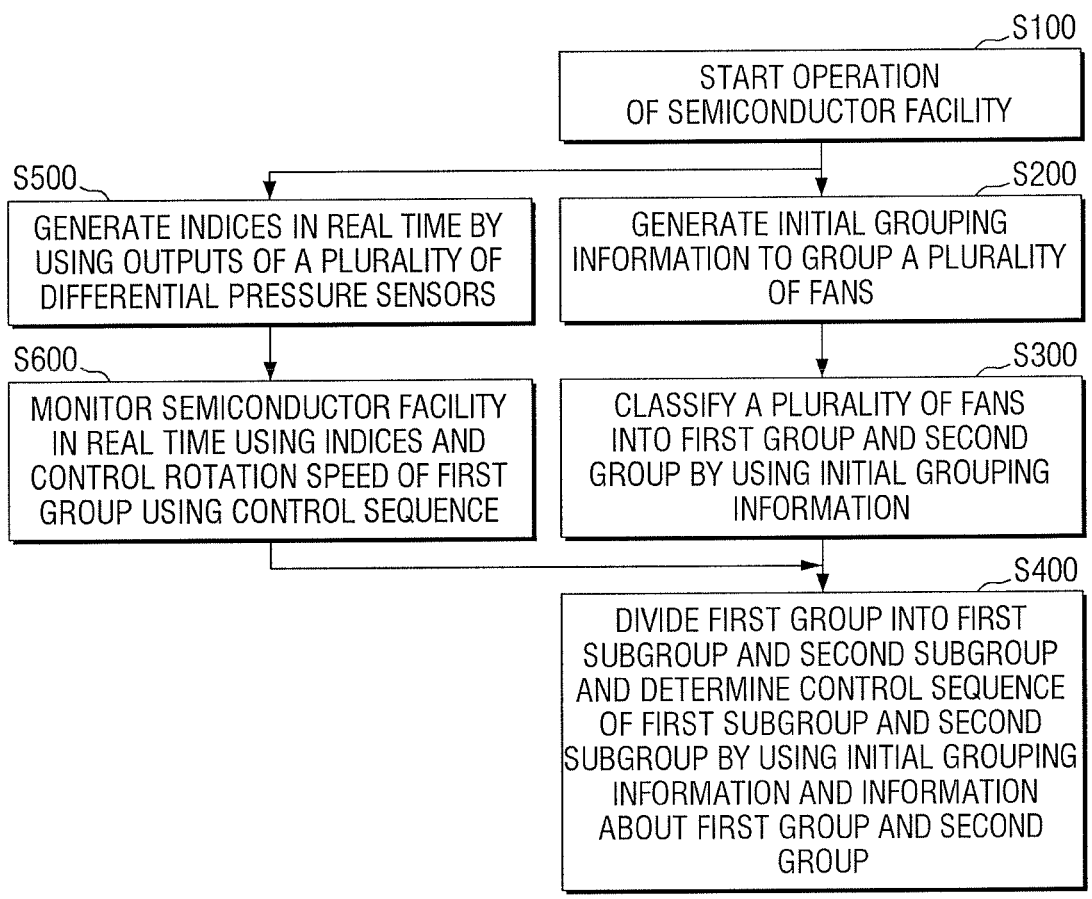
FIG. 3 illustrates an embodiment for operating the system.

FIG. 3 illustrates an embodiment for operating the system 200 for controlling the semiconductor manufacturing facility 100 of FIG. 1. FIGS. 4 to 6 illustrate embodiments of the initial grouping unit 210, the grouping unit 220, and the sequence determinator 230 of FIG. 1, respectively.

Referring to FIGS. 1, 3, and 4, after operation of the semiconductor manufacturing facility 100 is started in operation S100, initial grouping information IIG may be generated in operation S200. When a pressure condition is changed from a first pressure condition to a second pressure condition using a plurality of fans (e.g., 121, 122, 123, and 124) of the semiconductor manufacturing facility 100, the initial grouping unit 210 may measure first to third output change amounts of the first to third differential pressure sensors 111, 112, and 113.

The pressure condition may be related to the pressure difference (e.g., differential pressure) between each apparatus 101, 102, or 103 in the semiconductor manufacturing facility 100 and outside the semiconductor manufacturing facility 100. The first pressure condition may be different from the second pressure condition. For example, the differential pressure of the first apparatus 101 under the first pressure condition may be different from the differential pressure of the first apparatus 101 under the second pressure condition. In some embodiments, the first pressure condition may be, for example, the operating pressure of the semiconductor manufacturing facility 100. The operating pressure of the semiconductor manufacturing facility 100 may be a differential pressure that does not allow particles outside the semiconductor manufacturing facility 100 to flow into the semiconductor manufacturing facility 100. In order to change the pressure condition from the first pressure condition to the second pressure condition, for example, the rotation speed of the fans may be changed.

The first to third output change amounts may be amounts of change between measured values of the first to third differential pressure sensors 111, 112, and 113 under the first pressure condition and measured values of the first to third differential pressure sensors 111, 112, and 113 under the second pressure condition. For example, a1 among the first output change amounts a1, b1, c1, and d1 may be the amount of change in the measured value of the first differential pressure sensor 111 according to a change in the rotation speed of the first fan 121 when the pressure condition is changed from the first pressure condition to the second pressure condition.

For example, a2 among the second output change amounts a2, b2, c2, and d2 may be the amount of change in the measured value of the second differential pressure sensor 112 according to the change in the rotation speed of the first fan 121 when the pressure condition is changed from the first pressure condition to the second pressure condition.

For example, a3 among the third output change amounts a3, b3, c3, and d3 may be the amount of change in the measured value of the third differential pressure sensor 113 according to the change in the rotation speed of the first fan 121 when the pressure condition is changed from the first pressure condition to the second pressure condition.

The initial grouping information IIG may include the first output change amounts a1 through d1 of the first differential pressure sensor 111, the second output change amounts d2a2, b2, c2, and d2 of the second differential pressure sensor 112 and the third output change amounts a3 through d3 of the third differential pressure sensor 113 when the pressure condition is changed from the first pressure condition to the second pressure condition using the fans (e.g., 121, 122, 123 and 124) of the semiconductor manufacturing facility 100.

Referring to FIGS. 1, 3, and 5, in operation S300, some of the fans may be classified as a first group G1. The rest of the fans may be classified as a second group G2 sing the initial grouping information IIG.

The first output change amounts a1, b1, c1, and d1 may include the output change amount a1 for the first fan 121, the output change amount b1 for the second fan 122, the output change amount c1 for the third fan 123, and the output change amount d1 for the fourth fan 124. The second output change amounts a2, b2, c2, and d2 may include the output change amount a2 for the first fan 121, the output change amount b2 for the second fan 122, the output change amount c2 for the third fan 123, and the output change amount d2 for the fourth fan 124. The third output change amounts a3, b3, c3, and d3 may include the output change amount a3 for the first fan 121, the output change amount b3 for the second fan 122, the output change amount c3 for the third fan 123, and the output change amount d3 for the fourth fan 124.

For example, when the pressure condition is changed from the first pressure condition to the second pressure condition (by adjusting the rotation speed of the first fan 121), if any of the first output change amount a1, the second output change amount a2, or the third output change amount a3 for the first fan 121 is greater than or equal to a reference change amount, the first fan 121 may be included in the first group G1.

For example, when the pressure condition is changed from the first pressure condition to the second pressure condition (by adjusting the rotation speed of the first fan 121), the first output change amount a1 for the first fan 121 may be greater than or equal to the reference change amount and the second and third output change amounts a2 and a3 for the first fan 121 may be smaller than the reference change amount. This may mean that when the rotation speed of the first fan 121 is changed, the first apparatus 101 is more affected by the first fan 121 than the second and third apparatuses 102 and 103. Thus, in this case, as the rotation speed of the first fan 121 is changed, the differential pressure of the first apparatus 101 may be changed by more than the differential pressures of the second and third apparatuses 102 and 103. This may mean that the first fan 121 has a greater effect on the first apparatus 101 than on the second and third apparatuses 102 and 103.

When the pressure condition is changed from the first pressure condition to the second pressure condition, by adjusting the rotation speed of the third fan 123, the first through third output change amounts c1, c2, and c3 for the third fan 123 may be greater than or equal to the reference change amount. This may mean that all of the first through third apparatuses 101, 102, and 103 are significantly affected by a change in the rotation speed of the third fan 123.

When the pressure condition is changed from the first pressure condition to the second pressure condition by adjusting the rotation speed of the fourth fan 124, the third output change amount d3 for the fourth fan 124 may be greater than or equal to the reference change amount and the first and second output change amounts d1 and d2 for the fourth fan 124 may be less than the reference change amount. This may mean that, when the rotation speed of the fourth fan 124 is changed, the third apparatus 103 is more affected by the fourth fan 124 than the first and second apparatuses 101 and 102. Thus, in this case, as the rotation speed of the fourth fan 124 is changed, the differential pressure of the third apparatus 103 may be changed more than the differential pressures of the first and second apparatuses 101 and 102. This may mean that the fourth fan 124 has a greater effect on the third apparatus 103 than on the first and second apparatuses 101 and 102.

When the pressure condition is changed from the first pressure condition to the second pressure condition (by adjusting the rotation speed of the second fan 122), all of the first through third output change amounts b1, b2, and b3 for the second fan 122 may be less than the reference change amount. This may mean that all of the first to third apparatuses 101, 102, and 103 are not significantly affected by a change in the rotation speed of the second fan 122.

In this case, the first fan 121, the third fan 123, and the fourth fan 124 may be included in the first group G1 and the second fan 122 may be included in the second group G2. Grouping information IG may include information about the first group G1 and the second group G2.

Referring to FIGS. 1, 3, and 6, in operation S400, using the initial grouping information IIG and the grouping information IG, the first group G1 may be divided into a first subgroup SG1 and a second subgroup SG2, and the control sequence of the first subgroup SG1 and the second subgroup SG2 may be determined.

For example, a1 among the first to third output change amounts a1, a2, and a3 for the first fan 121 may be a change amount equal to or greater than the reference change amount. d3 among the first to third output change amounts d1, d2, and d3 for the fourth fan 124 may be a change amount equal to or greater than the reference change amount. Also, c1, c2, and c3 among the first to third output change amounts c1, c2, and c3 for the third fan 123 may be change amounts that are equal to or greater than the reference change amount. In this case, the first fan 121 may be in the first subgroup SG1, and the third fan 123 and the fourth fan 124 may be in the second subgroup SG2.

For example, when first to third output change amounts for a specific fan in the first group G1 are all equal to or greater than the reference change amount, the specific fan may be included in the first subgroup SG1. When only some of the first to third output change amounts for the specific fan in the first group G1 are equal to or greater than the reference change amount, the specific fan may be included in the second subgroup SG2.

When the pressure inside the semiconductor manufacturing facility 100 needs to be adjusted using a plurality of fans due to an abnormality in the flow of air in the semiconductor manufacturing facility 100 during operation of the semiconductor manufacturing facility 100, the rotation speed of the first subgroup SG1 may be adjusted. Then, the rotation speed of the second subgroup SG2 may be adjusted.

Referring back to FIGS. 1 and 3, in operation S500, indices may be generated using first to third outputs OUT1, OUT2, and OUT3 of the first to third differential pressure sensors 111, 112, and 113. Examples for generating the indices are described with reference to FIGS. 7 to 12.

In operation S600, the air flow in the semiconductor manufacturing facility 100 may be monitored in real time using the indices generated by the index generator 250. In addition, the controller 240 may control the rotation speed of the first group G1 using the indices generated by the index generator 250 and information IS about the control sequence.

Operation of the first index generator 253 (e.g., see FIG. 2) related to operation S500 of FIG. 3 according to embodiments will now be described with reference to FIGS. 7 to 9.

Figure 7:
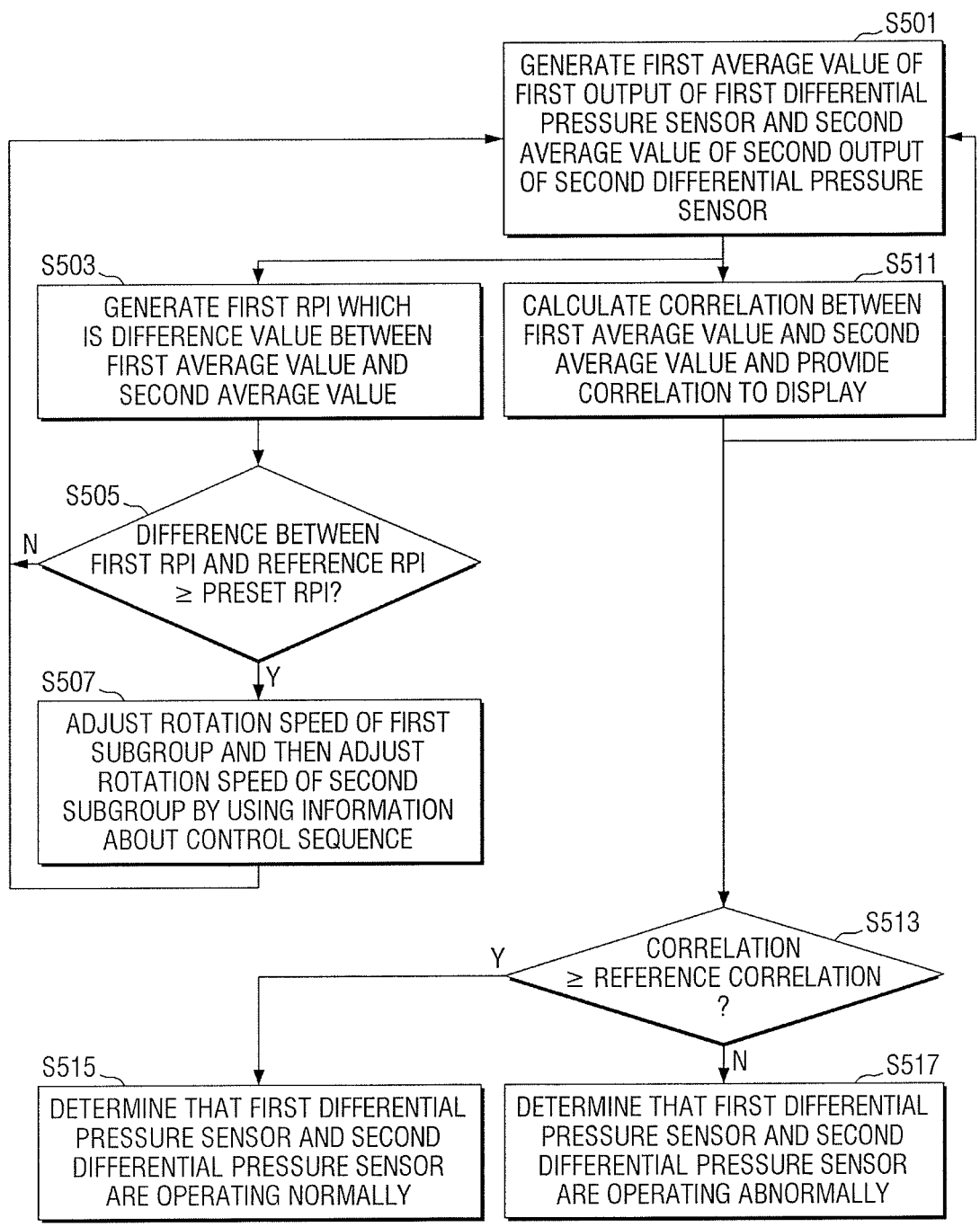
FIG. 7 illustrates an embodiment for operating index generators.

FIG. 7 illustrates an embodiment for operating the first index generator 253 (e.g., see FIG. 2) and the second index generator 255 (e.g., see FIG. 2), that is, illustrating operation S500 of FIG. 3. In FIG. 7, a case where an index is generated using the first output OUT1 of the first differential pressure sensor 111 (e.g., see FIG. 1) and the second output OUT2 of the second differential pressure sensor 112 (e.g., see FIG. 1) is illustrated. In one embodiment, an index may also be generated according to the method of FIG. 7 using the second output OUT2 of the second differential pressure sensor 112 (e.g., see FIG. 1) and the third output OUT3 of the third differential pressure sensor 113 (e.g., see FIG. 1).

Figure 8:
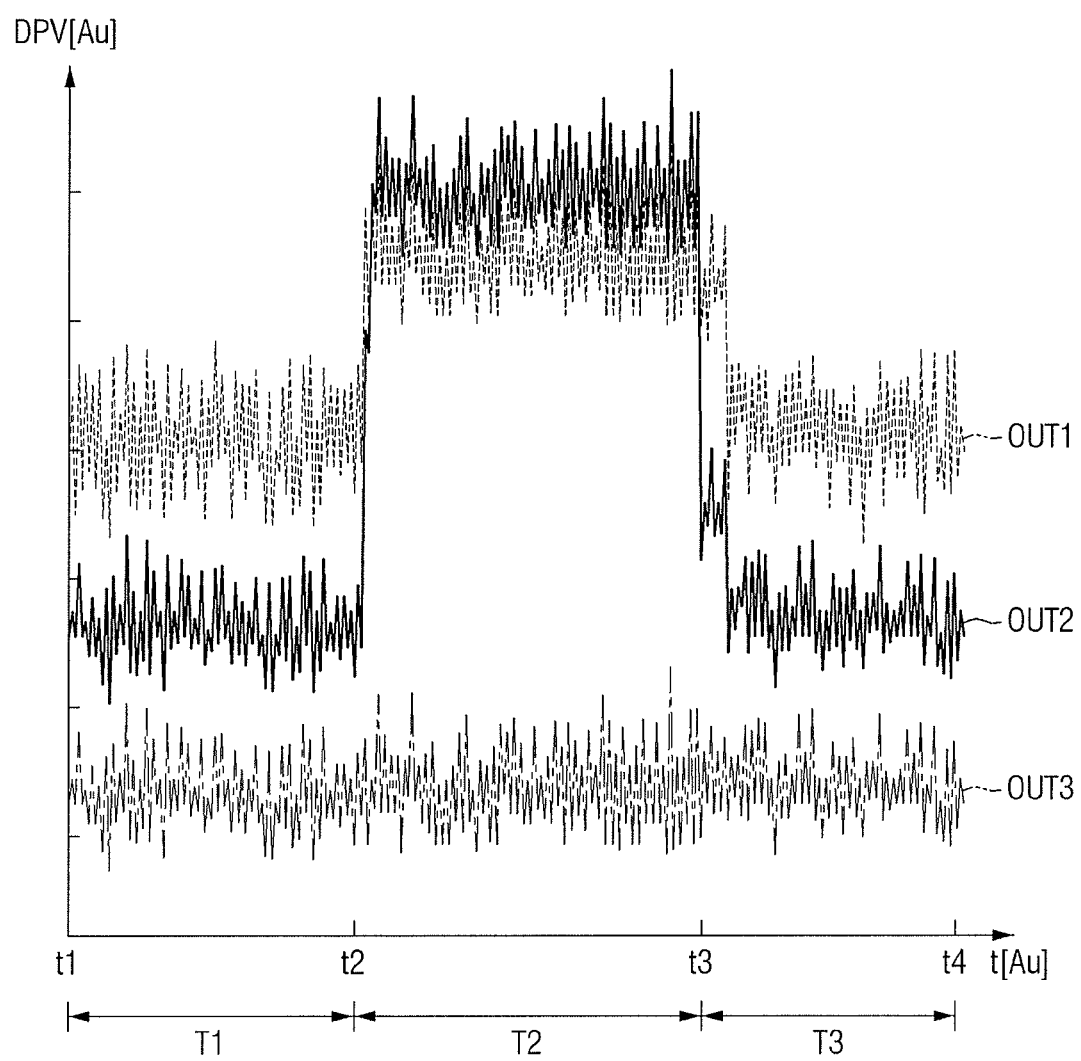
FIG. 8 illustrates an embodiment of outputs of differential pressure sensors.

FIG. 8 illustrates an embodiment of the first to third outputs OUT1, OUT2, and OUT3 of the first to third differential pressure sensors 111, 112, and 113 (e.g., see FIG. 1) over time. The first to third outputs OUT1, OUT2, and OUT3 of the first to third differential pressure sensors 111, 112, and 113 (e.g., see FIG. 1) of FIG. 8 may be measured, for example, under the operating pressure of the semiconductor manufacturing facility 100 (e.g., see FIG. 1). FIG. 9 illustrates an example of an output ORPI of the first index generator 253 of FIG. 2. In FIGS. 8 and 9, the x-axis may be time (unit: arbitrary unit (AU)), and the y-axis may be differential pressure DPV (unit: AU) output from a differential pressure sensor.

Figure 9:
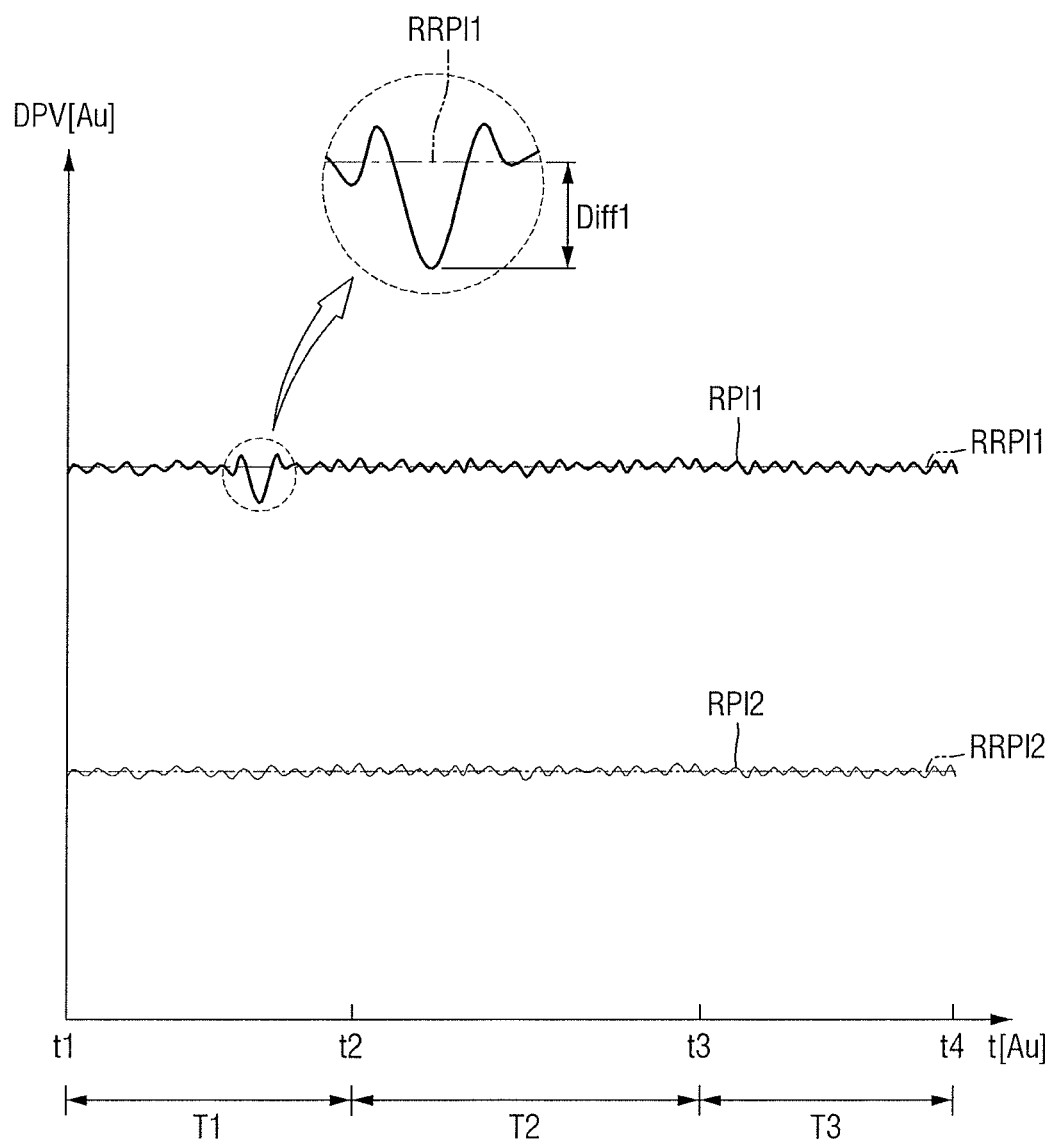
FIG. 9 illustrates an embodiment of an output of a first index generator.

Referring to FIGS. 7 to 9, in operation S501, the average calculator 251 (e.g., see FIG. 2) of the index generator 250 (e.g., see FIG. 2) may generate a first average value AVG1 (e.g., see FIG. 2) of the first output OUT1 of the first differential pressure sensor 111 (e.g., see FIG. 1), a second average value AVG2 (e.g., see FIG. 2) of the second output OUT2 of the second differential pressure sensor 112 (e.g., see FIG. 1), and a third average value AVG3 (e.g., see FIG. 2) of the third output OUT3 of the third differential pressure sensor 113 (e.g., see FIG. 1).

In one embodiment, the average calculator 251 (e.g., see FIG. 2) may generate the first to third average values AVG1, AVG2, and AVG3 (e.g., see FIG. 2) for the graph of FIG. 8.

In operation S503, as illustrated in FIG. 9, the first index generator 253 may generate a first RPI (which is a difference value between the first average value AVG1 and the second average value AVG2) and a second RPI which is a difference value between the second average value AVG2 and the third average value AVG3.

In operation S505, as illustrated in FIG. 9, a difference Diff1 between the first RPI and a first reference RPI RRPI1 may be compared with a preset RPI.

In operation S505, when the difference Diff1 between the first RPI and the first reference RPI RRPI1 is less than the preset RPI, generating of the first and second average values AVG1 and AVG2 in operation S501 may be performed again.

In operation S505, when the difference Diff1 between the first RPI and the first reference RPI RRPI1 is greater than the preset RPI, the rotation speed of each of the first subgroup SG1 of fans (e.g., see FIG. 6) and the second subgroup SG2 (e.g., see FIG. 6) of fans may be adjusted in operation S507.

In one embodiment, when the difference Diff1 between the first RPI and the first reference RPI RRPI1 is greater than the preset RPI, the air flow in the semiconductor manufacturing facility 100 may be considered to be abnormal. In this case, the controller 240 (e.g., see FIG. 1) may adjust the rotation speed of the first subgroup SG1 (e.g., see FIG. 6) using the information IS about the control sequence, and may then provide a control signal IC for adjusting the rotation speed of the second subgroup SG2 (e.g., see FIG. 6) to the semiconductor manufacturing facility 100 (e.g., see FIG. 1).

Examples of the operation of the second index generator 255 (e.g., see FIG. 2) related to operation S500 of FIG. 3 are described with reference to FIGS. 7 and 10.

Figure 10:
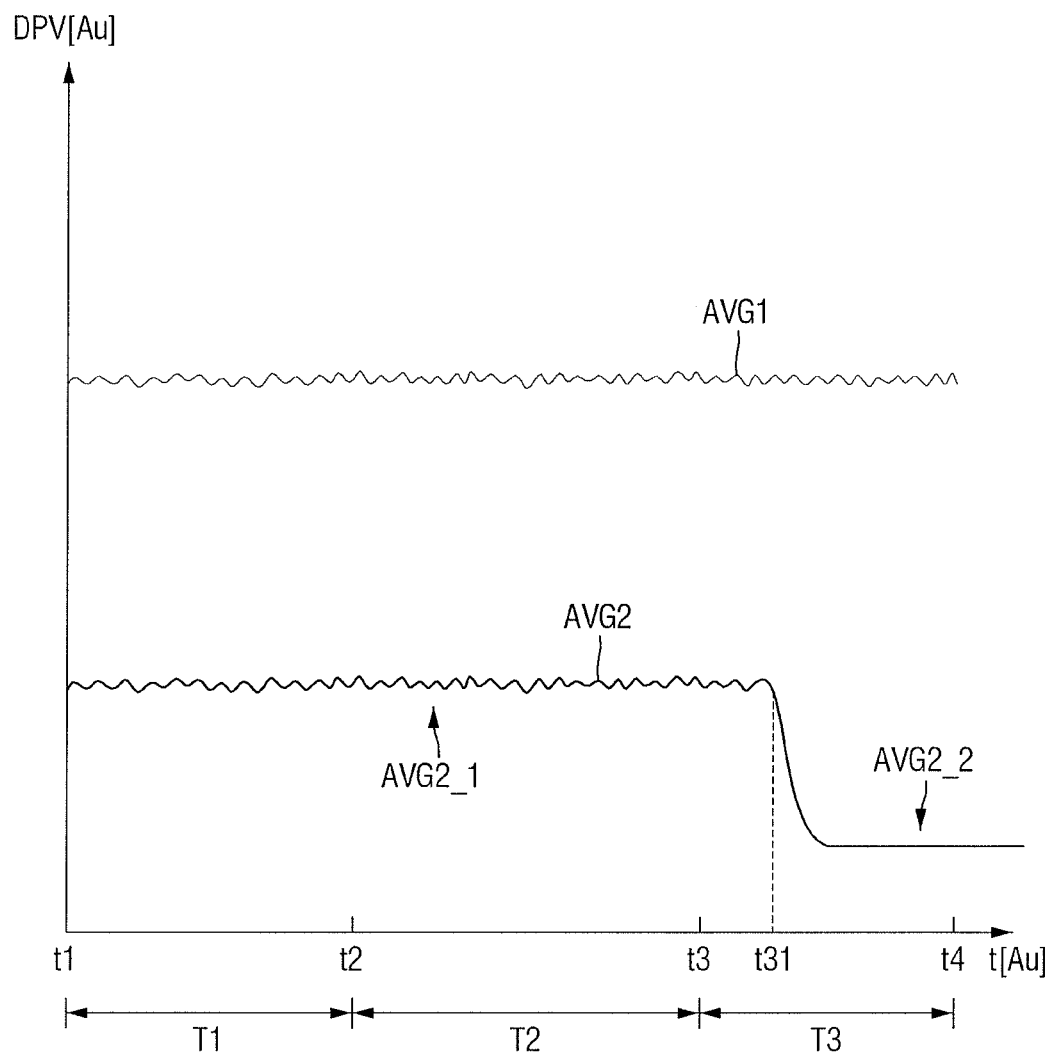
FIG. 10 illustrates an embodiment of an output of a second index generator.

FIG. 10 illustrates an example of an output OCI of the second index generator 255 of FIG. 2. In FIG. 10, the x-axis may be time (unit: AU), and the y-axis may be differential pressure DPV (unit: AU) output from a differential pressure sensor.

Referring to FIGS. 7 and 10, in operation S511, the second index generator 255 (e.g., see FIG. 2) may calculate a correlation between the first average value AVG1 and the second average value AVG2 and may provide the calculated correlation to the display 260 (e.g., see FIG. 1).

In operation S513, the correlation between the first average value AVG1 and the second average value AVG2 may be compared with a reference correlation.

In a time section between t1 (AU) and t31 (AU) in the graph of FIG. 10, a correlation between the first average value AVG1 and a (2-1)th average value AVG2_1 may be greater than or equal to the reference correlation. Therefore, it may be determined in operation S515 that the first differential pressure sensor 111 and the second differential pressure sensor 112 are operating normally.

In a time section between t31 (AU) and t4 (AU) in the graph of FIG. 10, a correlation between the first average value AVG1 and a (2-2)th average value AVG2_2 may be less than the reference correlation. Therefore, it may be determined, in operation S517, that the first differential pressure sensor 111 and the second differential pressure sensor 112 are operating abnormally.

Example operations of the third index generator 257 (e.g., see FIG. 2) related to operation S500 of FIG. 3 are described with reference to FIGS. 8, 11, and 12.

Figure 11:
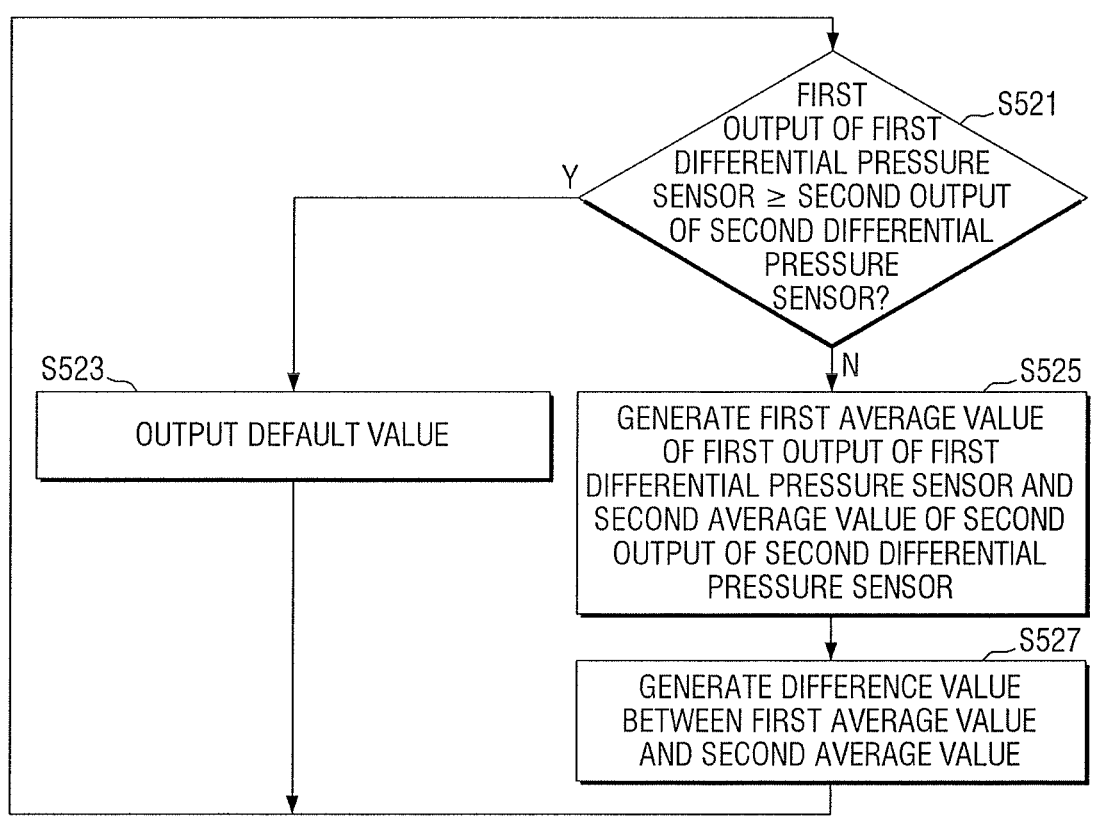
FIG. 11 illustrates an embodiment for operating a third index generator.

FIG. 11 illustrates an embodiment for operating the third index generator 257 (e.g., see FIG. 2), that is, operation S500 of FIG. 3. In FIG. 11, a case is illustrated where an index is generated using the first output OUT1 of the first differential pressure sensor 111 (e.g., see FIG. 1) and the second output OUT2 of the second differential pressure sensor 112 (e.g., see FIG. 1). In one embodiment, an index may also be generated according to the method of FIG. 11, for example, using the second output OUT2 of the second differential pressure sensor 112 (e.g., see FIG. 1) and the third output OUT3 of the third differential pressure sensor 113 (e.g., see FIG. 1).

Figure 12:
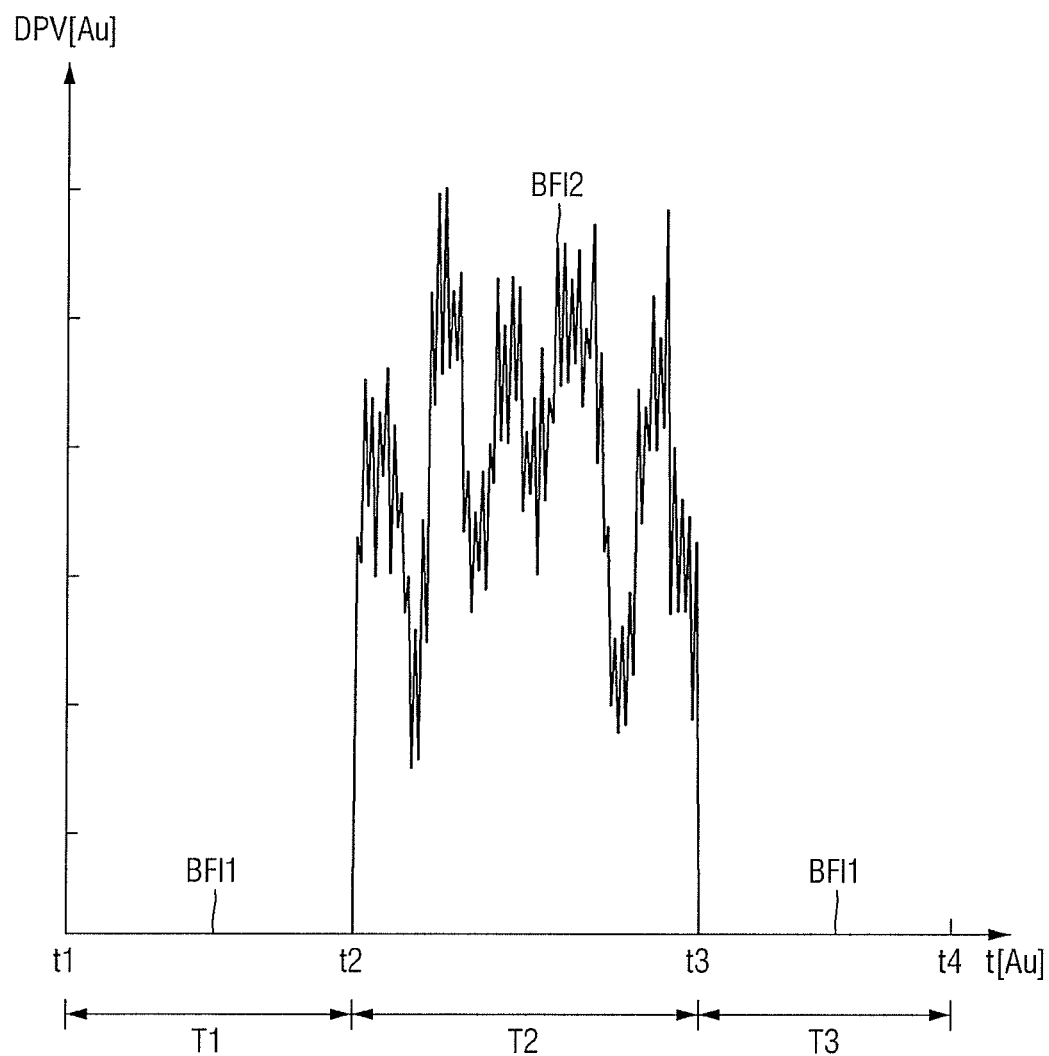
FIG. 12 illustrates an embodiment of an output of the third index generator.

FIG. 12 illustrates an example of an output OBFI of the third index generator 257 of FIG. 2 over time. In FIG. 12, the x-axis may be time (unit: AU), and the y-axis may be differential pressure DPV (unit: AU).

Referring to FIGS. 8, 11, and 12, in operation S521, the third index generator 257 may compare the first output OUT1 of the first differential pressure sensor 111 (e.g., see FIG. 1) and the second output OUT2 of the second differential pressure sensor 112 (e.g., see FIG. 1).

In a first time section T1 and a third time section T3 of the graph of FIG. 8, the first output OUT1 of the first differential pressure sensor 111 may be greater than the second output OUT2 of the second differential pressure sensor 112. The second output OUT2 of the second differential pressure sensor 112 may be greater than the third output OUT3 of the third differential pressure sensor 113. In this case, the third index generator 257 (e.g., see FIG. 2) may output a default value as a first BFI BFI1 in operation S523, as shown, for example, in the first time section T1 and the third time section T3 of the graph of FIG. 12. When the third index generator 257 outputs the default value, operation S521 may be performed again.

In a second time section T2 of the graph of FIG. 8, the first output OUT1 of the first differential pressure sensor 111 (e.g., see FIG. 1) may be less than the second output OUT2 of the second differential pressure sensor 112 (e.g., see FIG. 1).

In operation S525, the first average value AVG1 (e.g., see FIG. 2) of the first output OUT1 of the first differential pressure sensor 111 (e.g., see FIG. 1) and the second average value AVG2 (e.g., see FIG. 2) of the second output OUT2 of the second differential pressure sensor 112 may be generated for the second time section T2.

In the operation S527, a second BFI BFI2 which is a difference value between the first average value AVG1 (e.g., see FIG. 2) and the second average value AVG2 (e.g., see FIG. 2) in the second time section T2 may be generated as shown, for example, in the second time section T2 of the graph of FIG. 12.

For example, the graph of FIG. 12 may be output to the display 260 (e.g., see FIG. 1). When the second BFI BFI2 is output in the second time section T2, this may be interpreted to mean that the direction of air flow between the first apparatus 101 (e.g., see FIG. 1) and the second apparatus 102 (e.g., see FIG. 1) has been reversed.

In accordance with one or more embodiments of the method for controlling a semiconductor manufacturing facility, indices RPI, BFI and CI are generated using the first through third outputs OUT1, OUT2, and OUT3 of the first to third differential pressure sensors 111, 112, and 113. Therefore, a pressure change in the semiconductor manufacturing facility 100 may be determined intuitively or based on various predetermined criteria and/or without expert input.

In addition, in accordance with one or more embodiments of the method for controlling a semiconductor manufacturing facility, fans to be controlled are extracted by grouping a plurality of fans and the control sequence of the extracted fans are determined. For example, the first fan 121, the third fan 123, and the fourth fan 124 among the first through fourth fans 121, 122, 123 and 124 may be included in the first group G1 (e.g., see FIG. 5) and extracted as control targets.

Further, some of the fans in the first group G1 (e.g., see FIG. 5) may be in the first subgroup SG1 (e.g., see FIG. 6). Therefore, when an abnormality is detected during index monitoring, the first subgroup SG1 (e.g., see FIG. 6) may be controlled first.

When the pressure of the semiconductor manufacturing facility 100 is outside the operating pressure range of the semiconductor manufacturing facility 100, and when the semiconductor manufacturing facility 100 is controlled according to one or more of the method embodiments disclosed herein, the time to bring the pressure of the semiconductor manufacturing facility 100 within the operating pressure range of the semiconductor manufacturing facility 100 may be reduced. In at least one embodiment, the time required to bring the pressure of the semiconductor manufacturing facility 100 within the operating pressure range of the semiconductor manufacturing facility 100 may be reduced, first, by adjusting the rotation speed of fans (for example, the first subgroup SG1 (e.g., see FIG. 6)) highly related to apparatuses in the semiconductor manufacturing facility 100.

Figure 13:
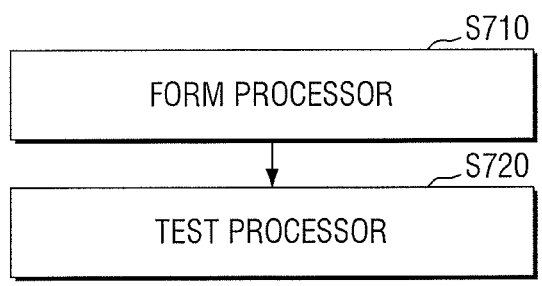
FIG. 13 illustrates an embodiment of a method for testing a processor including a system for controlling a semiconductor manufacturing facility.

FIG. 13 illustrates an embodiment of a method for testing a processor including a system 200 for controlling a semiconductor manufacturing facility according to embodiments. The processor may be implemented as hardware or hardware programmed with software.

Referring to FIG. 13, in operation S710, a processor may be formed as a part of a wafer or package including one or more different processors. In some embodiments, when a pressure condition is changed from a first pressure condition to a second pressure condition using a plurality of fans (e.g., the first to fourth fans 121, 122, 123, and 124 of FIG. 1) of a semiconductor manufacturing facility 100 (e.g., see FIG. 1), the processor may measure first to third output change amounts a1, a2, a3, b1, b2, b3, c1, c2, and c3 (e.g., see FIG. 4) of first to third differential pressure sensors 111, 112, and 113 (e.g., see FIG. 1) in the semiconductor manufacturing facility 100 (e.g., see FIG. 1).

The first differential pressure sensor 111 (e.g., see FIG. 1) may measure a pressure difference between the outside of the semiconductor manufacturing facility 100 (e.g., see FIG. 1) and a first point P1 (e.g., see FIG. 1) in the semiconductor manufacturing facility 100.

The second differential pressure sensor 112 (e.g., see FIG. 1) may measure a pressure difference between the outside of the semiconductor manufacturing facility 100 (e.g., see FIG. 1) and a second point P2 (e.g., see FIG. 1) in the semiconductor manufacturing facility 100 (e.g., see FIG. 1).

The third differential pressure sensor 113 (e.g., see FIG. 1) may measure a pressure difference between the outside of the semiconductor manufacturing facility 100 (e.g., see FIG. 1) and a third point P3 (e.g., see FIG. 1) in the semiconductor manufacturing facility 100 (see FIG. 1).

The first output change amounts a1, b1, c1, and d1 (e.g., see FIG. 4) may be amounts of change between measured values of the first differential pressure sensor 111 (e.g., see FIG. 1) under the first pressure condition and measured values of the first differential pressure sensor 111 (e.g., see FIG. 1) under the second pressure condition.

The second output change amounts a2, b2, c2, and d2 (e.g., see FIG. 4) may be amounts of change between measured values of the second differential pressure sensor 112 (e.g., FIG. 1) under the first pressure condition and measured values of the second differential pressure sensor 112 (e.g., FIG. 1) under the second pressure condition.

The third output change amounts a3, b3, c3, and d3 (e.g., see FIG. 4) may be amounts of change between measured values of the third differential pressure sensor 113 (e.g., see FIG. 1) under the first pressure condition and measured values of the third differential pressure sensor 113 (e.g., see FIG. 1) under the second pressure condition.

Using the first to third output change amounts a1, a2, a3, b1, b2, b3, c1, c2, and c3 (e.g., see FIG. 4), the processor may classify some (e.g., the first fan 121, the third fan 123, and the fourth fan 124 of FIG. 1) of the fans 121, 122, 123, and 124 (e.g., see FIG. 1) as a first group G1 (e.g., see FIG. 5) and the rest (e.g., the second fan 122 of FIG. 2) of the fans 121, 122, 123, and 124 (e.g., see FIG. 1) as a second group G2 (e.g., FIG. 5).

Using the first to third output change amounts a1, a2, a3, b1, b2, b3, c1, c2, and c3 (e.g., see FIG. 4), the processor may classify some (e.g., the third fan 123 of FIG. 1) of the fans of the first group G1 (e.g., see FIG. 5) as a first subgroup SG1 (e.g., see FIG. 6) and classify the rest (e.g., the first fan 121 and the fourth fan 124 of FIG. 1) of the fans of the first group G1 (e.g., see FIG. 5) as a second subgroup SG2, and may determine the control sequence of the first subgroup SG1 (e.g., see FIG. 6) and the second subgroup SG2 (e.g., see FIG. 6).

The processor may calculate a first average value AVG1 (e.g., see FIG. 2) which is an average value of a first output OUT1 (e.g., see FIG. 1) of the first differential pressure sensor 111 (e.g., see FIG. 1) under the operating pressure of the semiconductor manufacturing facility 100 (e.g., see FIG. 1), a second average value AVG2 (e.g., see FIG. 2) which is an average value of a second output OUT2 (e.g., see FIG. 1) of the second differential pressure sensor 112 (e.g., see FIG. 1) under the operating pressure of the semiconductor manufacturing facility 100 (e.g., see FIG. 1), and a third average value AVG3 (e.g., see FIG. 2) which is an average value of a third output OUT3 (e.g., see FIG. 1) of the third differential pressure sensor 113 (see FIG. 1) under the operating pressure of the semiconductor manufacturing facility 100 (see FIG. 1).

The processor may generate a first RPI, which is a difference value between the first average value AVG1 (e.g., see FIG. 2) and the second average value AVG2, and a second RPI which is a difference value between the second average value AVG2 and the third average value AVG3.

The processor may receive information IG (e.g., see FIG. 1) about the first and second groups G1 and G2 (e.g., see FIG. 5), information IS (e.g., see FIG. 1) about the control sequence, the first RPI and the second RPI and generate a control signal IC (e.g., see FIG. 1) for adjusting the rotation speed of each of the fans 121, 122, 123, and 124 (e.g., see FIG. 1).

In some embodiments, in a first time section T1 (e.g., see FIG. 8), the processor may generate the first RPI, which is the difference value between the first average value AVG1 (e.g., see FIG. 2) which is the average value of the first output OUT1 (e.g., see FIG. 1) of the first differential pressure sensor 111 (e.g., see FIG. 1) in the semiconductor manufacturing facility 100 (e.g., see FIG. 1) and the second average value AVG2 (e.g., see FIG. 2) which is the average value of the second output OUT2 (e.g., see FIG. 1) of the second differential pressure sensor 112 (e.g., see FIG. 1) in the semiconductor manufacturing facility 100 (see FIG. 1).

In addition, in the first time section T1 (e.g.,see FIG. 8), the processor may generate the second RPI which is the difference value between the second average value AVG (e.g., see FIG. 2) and the third average value AVG3 (e.g., see FIG. 2) which is the average value of the third output OUT3 (e.g., see FIG. 1) of the third differential pressure sensor 113 (e.g., see FIG. 1) in the semiconductor manufacturing facility 100 (see FIG. 1). In the first time section T1 (e.g., see FIG. 8), the first output OUT1 (e.g., see FIG. 8) may be greater than the second output OUT2 (e.g., see FIG. 8), and the second output OUT2 (e.g., see FIG. 8) may be greater than the third output OUT3 (e.g., see FIG. 8).

In the first time section T1 (e.g., see FIG. 8), the processor may generate a CI indicating a correlation between the first average value AVG1 (e.g., see FIG. 10) and the second average value AVG2 (e.g., see FIG. 10).

The processor may output a default value in the first time section T1 (e.g., see FIG. 8) and generate a BFI which is a difference value between the first average value AVG1 (e.g., see FIG. 2) and the second average value AVG2 (e.g., see FIG. 2) in a second time section T2 (e.g., see FIG. 8) in which the first output OUT1 (e.g., see FIG. 8) is smaller than the second output OUT2 (e.g., see FIG. 8).

Next, in operation S720, the processor may be tested. Testing the processor includes testing the processor and the at least one other processor using one or more electrical to optical converters, one or more optical splitters that split an optical signal into two or more optical signals, and one or more optical to electrical converters.

Figure 14:
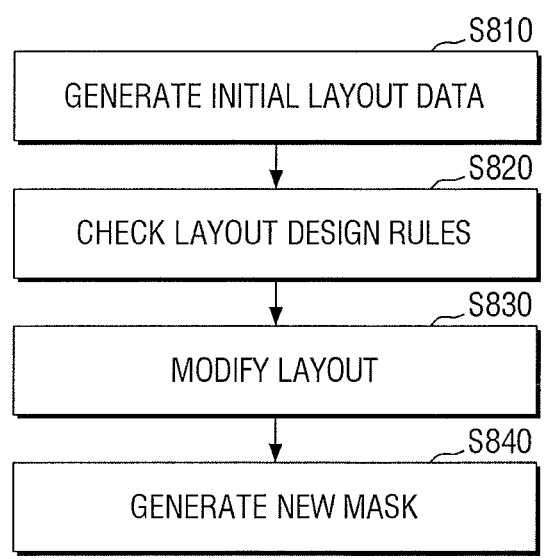
FIG. 14 illustrates an embodiment of a method for manufacturing an integrated circuit including a processor.

FIG. 14 illustrating an embodiment of a method for manufacturing an integrated circuit including a processor. Referring to FIG. 14, in operation S810, initial layout data may be generated to generate a mask layout for a set of features of a layer of an integrated circuit. The mask layout may include, for example, standard cell library macros for one or more circuit features that include a processor. The processor may be the processor described above with reference to FIG. 13.

In operation S820, design rule check may be performed by disregarding relative positions of the standard cell library macros for compliance with layout design rules during the generation of the mask layout.

In operation S830, layout modification may be performed by checking the relative positions of the standard cell library macros for compliance with the layout design rules after the generation of the mask layout.

In operation S840, a new layout design may be formed. When noncompliance with the layout design rules by any of the standard cell library macros is detected, the mask layout may be modified by modifying each of the noncompliant macros to comply with the layout design rules. In addition, a mask may be generated according to the modified mask layout having the set of features of the layer of the integrated circuit, and the layer of the integrated circuit may be manufactured according to the generated mask.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The controllers, processors, calculators, generators, determinators, comparators, units, and other signal generating, signal providing, and signal processing features of the embodiments disclosed herein may be implemented in non-transitory logic which, for example, may include hardware, software, or both. When implemented at least partially in hardware, the controllers, processors, calculators, generators, comparators, determinators, units, and other signal generating, signal providing, and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, calculators, generators, comparators, units, determinators, and other signal generating, signal providing, and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments described herein.

"About," "approximately," or "substantially," as used herein is inclusive of the stated value and means within an acceptable range of deviation for the particular value as determined by one of ordinary skill in the art, considering the measurement in question and the error associated with measurement of the particular quantity (e.g., the limitations or tolerances of the measurement system). For example, "about," "approximately," or "substantially," may mean within one or more standard deviations, or within ±30%, 20%, 10%, 5% of the stated value.

The various operations of methods described above may be performed by any suitable means capable of performing the operations, such as various hardware and/or software component(s), circuits, and/or module(s).

The software may comprise an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

By way of summation and review, one or more of the aforementioned embodiments provide a system and method for controlling a semiconductor manufacturing facility, the system and method being employed to control the pressure inside a semiconductor manufacturing facility by determining the control sequence of a plurality of fans in the semiconductor manufacturing facility. In accordance with these or more other embodiments, a system and method for controlling a semiconductor manufacturing facility is provided and employed to monitor a pressure change in a semiconductor manufacturing facility using outputs of differential pressure sensors inside the semiconductor manufacturing facility.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A method for controlling a semiconductor manufacturing facility, the method comprising:
   measuring, by grouping logic, first, second, and third output change amounts of respective first, second, and third differential pressure sensors in the semiconductor manufacturing facility when a pressure condition is changed from a first pressure condition to a second pressure condition by a plurality of fans in the semiconductor manufacturing facility, and classifying some of the fans as a first group and remaining ones of the fans as a second group based on the first through third output change amounts;
   classifying, by a sequence determinator, some of the fans in the first group as a first subgroup and remaining ones of the fans in the first group as a second subgroup, and determining a control sequence of the first subgroup and the second subgroup based on the first to third output change amounts;
   calculating, by an index generator, a first difference value, a second difference value, and a third difference value,
      the first difference value based on a difference between a first average value, which is an average value of a first output of the first differential pressure sensor under an operating pressure of the semiconductor manufacturing facility, and a target value which is a target output value of the semiconductor manufacturing facility,
      the second difference value based on a difference between a second average value, which is an average value of a second output of the second differential pressure sensor under the operating pressure of the semiconductor manufacturing facility, and the target value, and
      the third difference value based on a difference between a third average value, which is an average value of a third output of the third differential pressure sensor under the operating pressure of the semiconductor manufacturing facility, and the target value; and
   generating a first regulation performance index (RPI) corresponding to a difference between the first difference value and the second difference value and a second RPI corresponding to a difference between the second difference value and the third difference value; and
   receiving, by a controller, information corresponding to the first and second groups, information corresponding to the control sequence and the first RPI and the second RPI and generating a control signal to adjust a rotation speed of each of the fans, wherein:
   the first differential pressure sensor is to measure a pressure difference between outside of the semiconductor manufacturing facility and a first point in the semiconductor manufacturing facility,
   the second differential pressure sensor is to measure a pressure difference between outside of the semiconductor manufacturing facility and a second point in the semiconductor manufacturing facility,
   the third differential pressure sensor is to measure a pressure difference between outside of the semiconductor manufacturing facility and a third point in the semiconductor manufacturing facility,
   the first output change amount corresponds to an amount of change between a measured value of the first differential pressure sensor under the first pressure condition and a measured value of the first differential pressure sensor under the second pressure condition,
   the second output change amount corresponds to an amount of change between a measured value of the second differential pressure sensor under the first pressure condition and a measured value of the second differential pressure sensor under the second pressure condition, and
   the third output change amount corresponds to an amount of change between a measured value of the third differential pressure sensor under the first pressure condition and a measured value of the third differential pressure sensor under the second pressure condition.

2. The method as claimed in claim 1, wherein classifying some of the fans in the first group as the first subgroup by the sequence determinator includes:
   including a first fan in the first subgroup when all of the first to third output change amounts are equal to or greater than a reference change amount when the pressure condition is changed from the first pressure condition to the second pressure condition based on an adjustment in the rotation speed of the first fan among the fans.

3. The method as claimed in claim 1, wherein:
   classifying some of the fans as the first group by the grouping logic includes including a first fan in the first group when any of the first to third output change amounts is greater than or equal to a reference change amount when the pressure condition is changed from the first pressure condition to the second pressure condition based on an adjustment of the rotation speed of the first fan among the fans, and
   classifying of remaining ones of the fans as the second group by using the grouping logic includes including a second fan in the second group if none of the first through third output change amounts is greater than or equal to the reference change amount when the pressure condition is changed from the first pressure condition to the second pressure condition by adjusting the rotation speed of the second fan among the fans.

4. The method as claimed in claim 1, further comprising by the index generator:
comparing the first output and the second output;
generating a default value as a first back flow index (BFI) when the first output is greater than the second output; and
generating a second BFI corresponding to a difference value between the first average value and the second average value, the second BFI generated in a time section in which the first output is less than the second output when the first output is less than the second output.

5. The method as claimed in claim 1, further comprising:
calculating, by the index generator, a correlation between the first average value and the second average value.

6. The method as claimed in claim 1, wherein:
when a difference between the first RPI and a reference RPI is greater than a preset RPI value, the control signal changes the rotation speed of the fans in the first subgroup and then the rotation speed of the fans in the second subgroup.

7. The method as claimed in claim 1, wherein:
the first point is closest to the second point, and
the second point is closest to the third point.

8. The method as claimed in claim 1, wherein an output of the first differential pressure sensor for a first apparatus in the semiconductor manufacturing facility under the second pressure condition is different from an output of the first differential pressure sensor for the first apparatus under the first pressure condition, and wherein the first point is located within the first apparatus.

9. The method as claimed in claim 1, wherein the first pressure condition is equal to the operating pressure of the semiconductor manufacturing facility.

10. A method of controlling a semiconductor manufacturing facility, the method comprising:
calculating, by a first index generator, a first difference value, a second difference value, and a third difference value in a first time section,
the first difference value corresponding to a difference between a first average value, which is an average value of a first output of a first differential pressure sensor in the semiconductor manufacturing facility, and a target value which is a target output value of the semiconductor manufacturing facility,
the second difference value corresponding to a difference between a second average value, which is an average value of a second output of a second differential pressure sensor in the semiconductor manufacturing facility, and the target value, and
a third difference value corresponding to a difference between a third average value, which is an average value of a third output of a third differential pressure sensor in the semiconductor manufacturing facility, and the target value;
generating a first regulation performance index (RPI) corresponding to a difference between the first difference value and the second difference value and a second RPI corresponding to a difference between the second difference value and the third difference value;
generating, by a second index generator, a correlation index (CI) indicating a correlation between the first average value and the second average value in the first time section;
outputting, by a third index generator, a default value in the first time section and generating a back flow index (BFI) corresponding to a difference value between the first average value and the second average value in a second time section in which the first output is less than the second output, wherein:
the first differential pressure sensor is to measure a pressure difference between outside of the semiconductor manufacturing facility and a first point in the semiconductor manufacturing facility,
the second differential pressure sensor is to measure a pressure difference between outside of the semiconductor manufacturing facility and a second point in the semiconductor manufacturing facility,
the third differential pressure sensor is to measure a pressure difference between outside of the semiconductor manufacturing facility and a third point in the semiconductor manufacturing facility,
the first output is greater than the second output in the first time section, and
the second output is greater than the third output in the first time section;
measuring, by a grouping logic, first, second and third output change amounts of the first, second, and third differential pressure sensors, respectively, in the semiconductor manufacturing facility when a pressure condition is change d from a first pressure condition to a second pressure condition using a plurality of fans in the semiconductor manufacturing facility;
classifying some of the fans as a first group and remaining ones of the fans as a second group based on the first to third output change amounts; and
generating a control signal to adjust a rotation speed of each of the plurality of fans based on the first RPI, the second RPI, and the first and second groups.

11. The method as claimed in claim 10, further comprising:
classifying, by a sequence determinator, some of the fans in the first group as a first subgroup and remaining ones of the fans in the first group as a second subgroup; and
determining a control sequence of the first subgroup and the second subgroup based on the first through third output change amounts; and
receiving, by a controller, information corresponding to the first and second groups, information corresponding to the control sequence and the first RPI and the second RPI, and generating the control signal to adjust the rotation speed of each of the plurality of fans, wherein:
the first output change amount corresponds to an amount of change between a measured value of the first differential pressure sensor under the first pressure condition and a measured value of the first differential pressure sensor under the second pressure condition,
the second output change amount corresponds to the amount of change between a measured value of the second differential pressure sensor under the first pressure condition and a measured value of the second differential pressure sensor under the second pressure condition, and
the third output change amount corresponds to the amount of change between a measured value of the third differential pressure sensor under the first pressure condition and a measured value of the third differential pressure sensor under the second pressure condition.

12. The method as claimed in claim 11, wherein classifying some of the fans in the first group as the first subgroup by the sequence determinator includes:
   including a first fan in the first subgroup when all of the first to third output change amounts are equal to or greater than a reference change amount when the pressure condition is changed from the first pressure condition to the second pressure condition by adjusting the rotation speed of the first fan among the fans.

13. The method as claimed in claim 11, wherein:
   classifying some of the fans as the first group by the grouping logic includes including a first fan in the first group when any of the first to third output change amounts is greater than or equal to a reference change amount when the pressure condition is changed from the first pressure condition to the second pressure condition by adjusting the rotation speed of the first fan among the fans, and
   classifying remaining ones of the fans as the second group by the grouping logic includes including a second fan in the second group when none of the first to third output change amounts is greater than or equal to the reference change amount when the pressure condition is changed from the first pressure condition to the second pressure condition by adjusting the rotation speed of the second fan among the fans.

14. The method as claimed in claim 11, wherein an output of the first differential pressure sensor for a first apparatus in the semiconductor manufacturing facility under the second pressure condition is different from an output of the first differential pressure sensor for the first apparatus under the first pressure condition, wherein the first point is located within the first apparatus.

15. The method as claimed in claim 11, wherein the first pressure condition is equal to an operating pressure of the semiconductor manufacturing facility.

16. A method of manufacturing an integrated circuit, the method comprising:
   generating a mask layout for a set of features of a layer of the integrated circuit, the mask layout including standard cell library macros for one or more circuit features that include a processor;
   disregarding relative positions of the standard cell library macros for compliance with layout design rules during generating the mask layout;
   checking the relative positions of the standard cell library macros for compliance with the layout design rules after generating the mask layout;
   modifying the mask layout by modifying any of the standard cell library macros which does not comply with the layout design rules to comply with the layout design rules;
   generating a mask according to the modified mask layout having the set of features of the layer of the integrated circuit; and
   manufacturing the layer of the integrated circuit according to the mask, wherein the processor is to:
   measure first, second, and third output change amounts of respective first, second, and third differential pressure sensors in a semiconductor manufacturing facility when a pressure condition is changed from a first pressure condition to a second pressure condition using a plurality of fans in the semiconductor manufacturing facility,
   classify some of the fans as a first group and remaining ones of the fans as a second group based on the first to third output change amounts,
   classify some of the fans in the first group as a first subgroup and remaining ones of the fans in the first group as a second subgroup,
   determine a control sequence of the first subgroup and the second subgroup based on the first to third output change amounts,
   calculate a first difference value, a second difference value, and a third difference value, wherein:
      the first difference value corresponds to a difference between a first average value, which is an average value of a first output of the first differential pressure sensor under an operating pressure of the semiconductor manufacturing facility, and a target value which is a target output value of the semiconductor manufacturing facility,
      the second difference value corresponds to a difference between a second average value, which is an average value of a second output of the second differential pressure sensor under the operating pressure of the semiconductor manufacturing facility, and the target value, and
      the third difference value corresponds to a difference between a third average value, which is an average value of a third output of the third differential pressure sensor under the operating pressure of the semiconductor manufacturing facility, and the target value,
   wherein the processor is to:
   generate a first RPI corresponding to a difference between the first difference value and the second difference value and a second RPI corresponding to a difference between the second difference value and the third difference value,
   receives information corresponding to the first and second groups, information corresponding to the control sequence and the first RPI and the second RPI,
   generate a control signal to adjust a rotation speed of each of the fans,
   wherein the first differential pressure sensor is to measure a pressure difference between outside the semiconductor manufacturing facility and a first point in the semiconductor manufacturing facility, the second differential pressure sensor is to measures a pressure difference between outside the semiconductor manufacturing facility and a second point in the semiconductor manufacturing facility, the third differential pressure sensor is to measure a pressure difference between outside the semiconductor manufacturing facility and a third point in the semiconductor manufacturing facility, and wherein:
   the first output change amount corresponds to an amount of change between a measured value of the first differential pressure sensor under the first pressure condition and a measured value of the first differential pressure sensor under the second pressure condition,
   the second output change amount corresponds to an amount of change between a measured value of the second differential pressure sensor under the first pressure condition and a measured value of the second differential pressure sensor under the second pressure condition, and
   the third output change amount corresponds to an amount of change between a measured value of the third differential pressure sensor under the first pressure condition and a measured value of the third differential pressure sensor under the second pressure condition.

17. The method as claimed in claim 16, wherein classifying some of the fans in the first group as the first subgroup includes:
including a first fan in the first subgroup when all of the first to third output change amounts are equal to or greater than a reference change amount when the pressure condition is changed from the first pressure condition to the second pressure condition by adjusting the rotation speed of the first fan among the fans.

18. The method as claimed in claim 16, wherein:
classifying some of the fans as the first group includes including a first fan in the first group when any of the first to third output change amounts is greater than or equal to a reference change amount when the pressure condition is changed from the first pressure condition to the second pressure condition by adjusting the rotation speed of the first fan among the fans, and
classifying the remaining ones of the fans as the second group includes including a second fan in the second group when none of the first through third output change amounts is greater than or equal to the reference change amount when the pressure condition is changed from the first pressure condition to the second pressure condition by adjusting the rotation speed of the second fan among the fans.

19. The method as claimed in claim 16, wherein the processor is to:
compare the first output and the second output,
generate a default value as a first BFI when the first output is greater than the second output, and
generate a second BFI corresponding to a difference value between the first average value and the second average value in a time section in which the first output is less than the second output when the first output is less than the second output.

20. The method as claimed in claim 16, wherein the processor is to calculate a correlation between the first average value and the second average value.

* * * * *